(12) United States Patent
Hirabayashi

(10) Patent No.: US 12,237,729 B2
(45) Date of Patent: Feb. 25, 2025

(54) ROTATING DEVICE

(71) Applicant: MINEBEA MITSUMI Inc., Nagano (JP)

(72) Inventor: Koichiro Hirabayashi, Kitasaku-gun (JP)

(73) Assignee: MINEBEA MITSUMI Inc., Nagano (JP)

( * ) Notice: Subject to any disclaimer, the term of this patent is extended or adjusted under 35 U.S.C. 154(b) by 229 days.

(21) Appl. No.: 17/905,209

(22) PCT Filed: Feb. 25, 2021

(86) PCT No.: PCT/JP2021/007055
§ 371 (c)(1),
(2) Date: Aug. 29, 2022

(87) PCT Pub. No.: WO2021/177131
PCT Pub. Date: Sep. 10, 2021

(65) Prior Publication Data
US 2023/0148272 A1 May 11, 2023

(30) Foreign Application Priority Data
Mar. 4, 2020 (JP) .................. 2020-037069

(51) Int. Cl.
*H02K 11/02* (2016.01)
*H02K 5/22* (2006.01)
(Continued)

(52) U.S. Cl.
CPC ............. *H02K 11/02* (2013.01); *H02K 5/225* (2013.01); *H02K 7/1166* (2013.01); *H02K 11/33* (2016.01); *H02K 2211/03* (2013.01)

(58) Field of Classification Search
CPC ...... H02K 11/02; H02K 5/225; H02K 7/1166; H02K 11/33; H02K 2211/03; H05K 9/00
(Continued)

(56) References Cited

U.S. PATENT DOCUMENTS

| 5,031,027 A | 7/1991 | Dorinski et al. |
| 6,400,058 B1 | 6/2002 | Liau |

(Continued)

FOREIGN PATENT DOCUMENTS

| CN | 1735315 A | 2/2006 |
| CN | 109600914 A2 | 4/2019 |

(Continued)

OTHER PUBLICATIONS

International Search Report for corresponding International Application No. PCT/JP2021/007055 mailed May 11, 2021.
(Continued)

*Primary Examiner* — Ahmed Elnakib
(74) *Attorney, Agent, or Firm* — Chrisman Gallo Tochtrop LLC

(57) ABSTRACT

The rotating device includes a housing, a motor, a gear transmitting rotation of the motor to an outside, a sensor, a connection terminal electrically connected to the outside, and a wiring board. The wiring board electrically connects the motor, the sensor, and the connection terminal. The wiring board is formed of a film having a flexibility. A rotation speed or a rotation angle of the gear is detectable by the sensor. An electronic component controlling the motor is mounted at the wiring board. A part of the wiring board includes a bent part or a curved part and surrounds a part of the electronic component.

11 Claims, 18 Drawing Sheets

(51) Int. Cl.
*H02K 7/116* (2006.01)
*H02K 11/33* (2016.01)

(58) Field of Classification Search
USPC .......................................................... 310/71
See application file for complete search history.

(56) References Cited

U.S. PATENT DOCUMENTS

| | | | |
|---|---|---|---|
| 9,935,521 | B2 | 4/2018 | Tsuda et al. |
| 11,419,208 | B2* | 8/2022 | Yoshinaga ............ B62D 5/0406 |
| 11,444,516 | B2* | 9/2022 | Tateyama ................ H05K 1/028 |
| 2002/0165440 | A1 | 11/2002 | Mason et al. |
| 2009/0201652 | A1 | 8/2009 | Chew et al. |
| 2013/0154411 | A1 | 6/2013 | Mawhinney et al. |
| 2015/0381016 | A1 | 12/2015 | Tsuda et al. |
| 2016/0065037 | A1* | 3/2016 | Buerger .............. F04D 13/0606 310/68 B |
| 2020/0266683 | A1* | 8/2020 | Hirabayashi ......... H02K 7/1166 |

FOREIGN PATENT DOCUMENTS

| | | | |
|---|---|---|---|
| JP | 58-105165 | U | 7/1983 |
| JP | S 58105165 | * | 7/1983 |
| JP | 2002-058209 | A | 2/2002 |
| JP | 2015-220969 | A | 12/2015 |
| JP | 2015-231256 | A | 12/2015 |
| JP | 2019-054600 | A | 4/2019 |
| JP | 2019054600 | * | 4/2019 |

OTHER PUBLICATIONS

Written Opinion for corresponding International Application No. PCT/JP2021/007055 dated May 11, 2021.
English translation of the Written Opinion for corresponding International Application No. PCT/JP2021/007055 dated May 11, 2021.
First Office Action dated Nov. 7, 2024 for corresponding Chinese Application No. 202180011315.4 and English translation.

* cited by examiner

ROTATING DEVICE

CROSS-REFERENCE TO RELATED APPLICATIONS

This application is a national stage entry of International Application No. PCT/JP2021/007055 filed on Feb. 25, 2021, which claims the benefit of priority to Japanese Application No. JP2020-037069, filed Mar. 4, 2020, the entire disclosures of which are hereby incorporated herein by reference.

TECHNICAL FIELD

The present invention relates to a rotating device.

BACKGROUND ART

Conventionally, there has been a rotating device (motor actuator) including a motor, an output gear, a sensor for detecting a rotational position (rotation angle) of the output gear, and electronic components such as an integrated circuit (IC) for a local interconnect network (LIN) for controlling the motor. The rotating device can, for example, drive a plurality of switching doors (louvers) provided at the middle of an air passage of a vehicle air conditioner system such as a DC heating ventilation and air conditioning (HVAC).

CITATION LIST

Patent Literature

Patent Document 1: JP 2002-058209 A
Patent Document 2: JP 2015-220969 A
Patent Document 3: JP 2015-231256 A

SUMMARY OF INVENTION

Technical Problem

In the above-described technology, electronic components such as an IC are required to have protective measures (electromagnetic compatibility (EMC) measures) against electromagnetic wave noises from a motor and the like disposed around the electronic components. As an EMC measure for a rotating device, for example, there is known a technique of mounting electronic components such as an IC on a printed circuit board (PCB) or the like having a multi-layer power distribution configuration.

However, when a PCB having a multi-layer power distribution configuration is used, a manufacturing cost may become high.

In one aspect, an object is to provide a rotating device capable of implementing EMC measures at a low cost.

Solution to Problem

In one aspect, a rotating device includes a housing, a motor, a gear transmitting rotation of the motor to an outside, a sensor, a connection terminal electrically connected to the outside, and a wiring board. The wiring board electrically connects the motor, the sensor, and the connection terminal. The wiring board is formed of a film having a flexibility. A rotation speed or a rotation angle of the gear is detectable by the sensor. An electronic component controlling the motor is mounted at the wiring board. A part of the wiring board includes a bent part or a curved part and surrounds at least a part of the electronic component.

According to the one aspect, it is possible to implement EMC measures at a low cost.

DESCRIPTION OF EMBODIMENTS

A rotating device disclosed in the present application will be described below with reference to the drawings. Note that the dimensional relationships, the proportions, and the like between elements may differ between the drawings and reality. Some parts may differ from each other in dimensional relationships and ratios between the drawings.

First Embodiment

Figure 1:
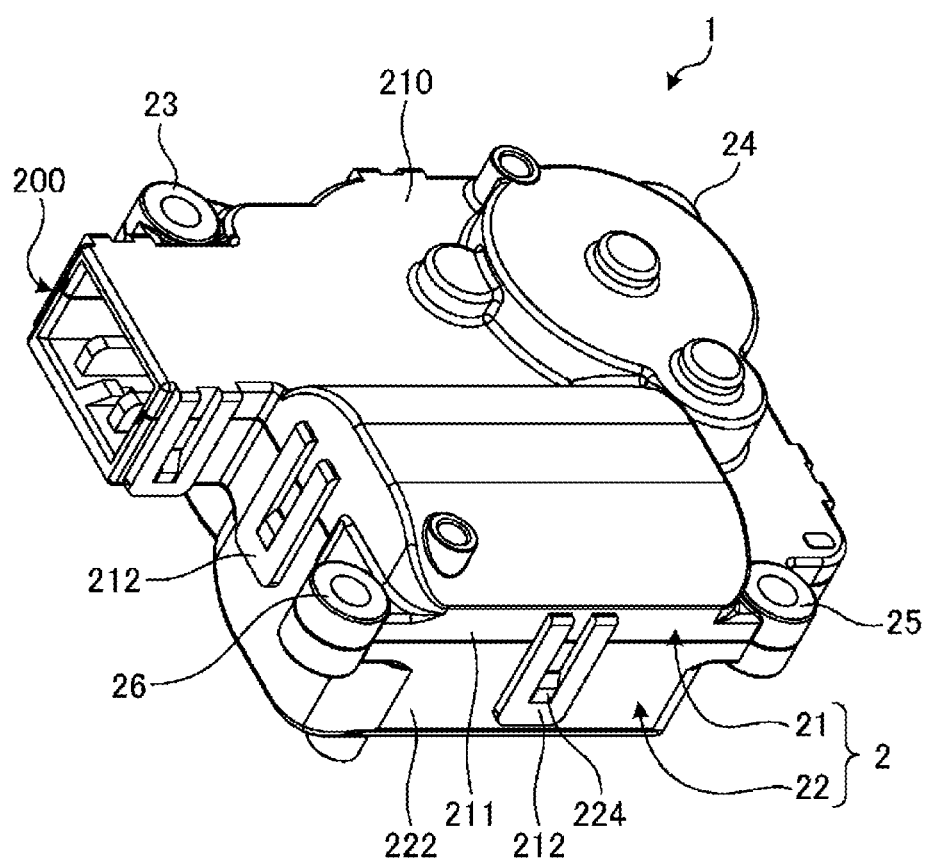
FIG. 1 is a perspective view of a rotating device according to a first embodiment.
Figure 2:
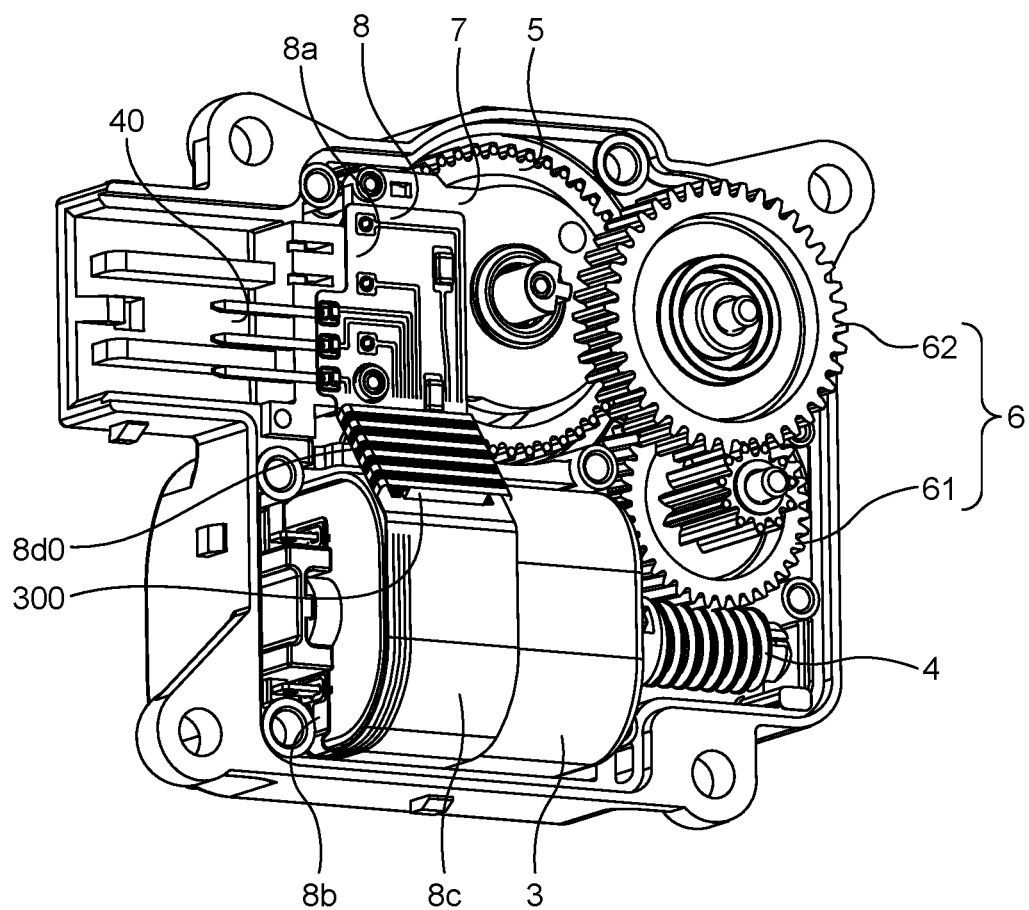
FIG. 2 is a perspective view of the rotating device according to the first embodiment with a first housing removed.
Figure 3:
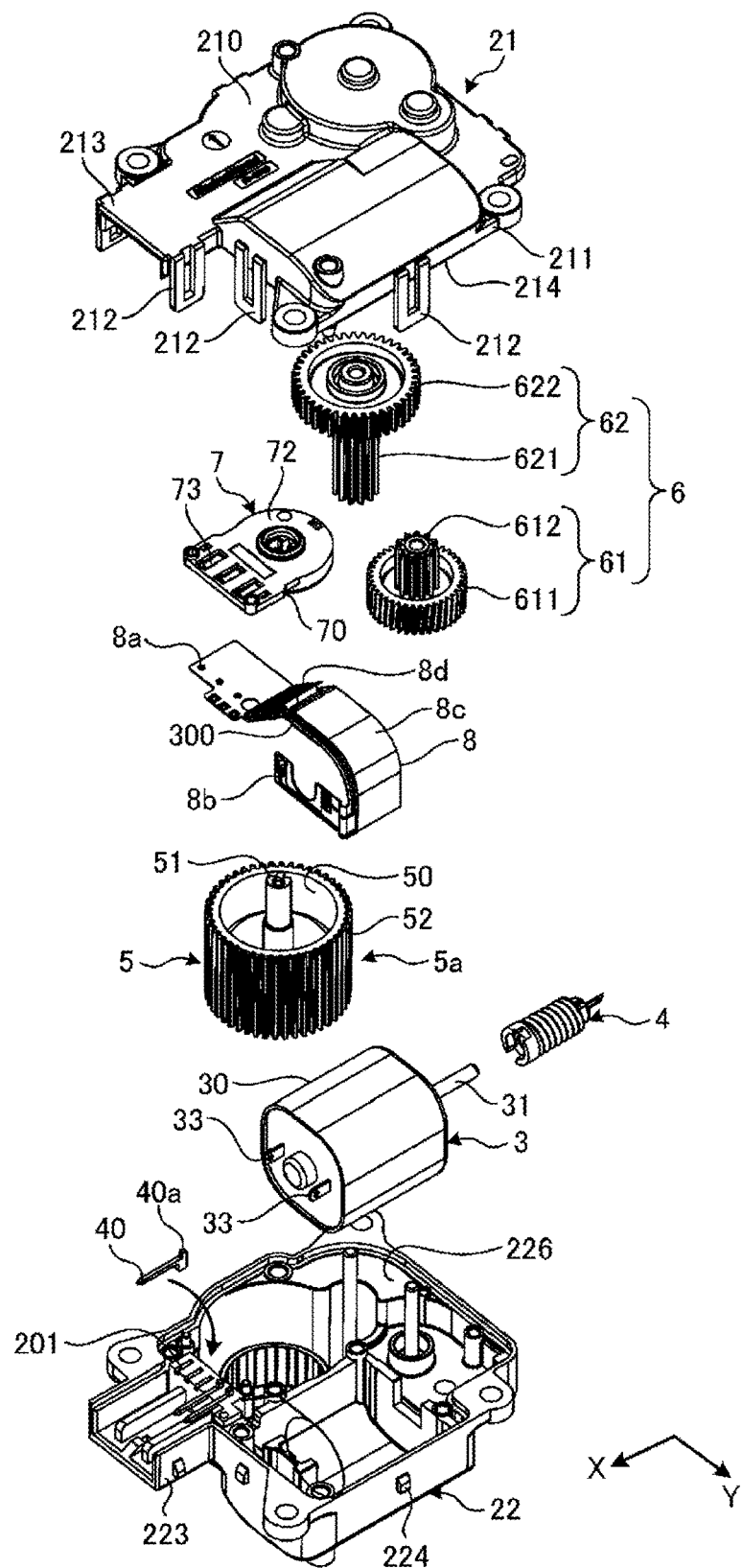
FIG. 3 is an exploded perspective view of the rotating device according to the first embodiment.
Figure 4:
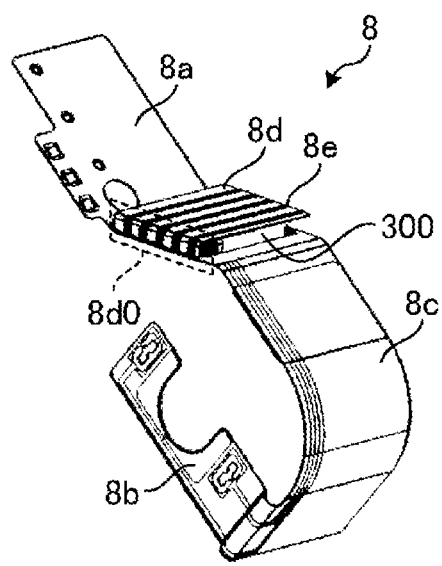
FIG. 4 is an enlarged perspective view of a wiring board according to the first embodiment.
Figure 5:
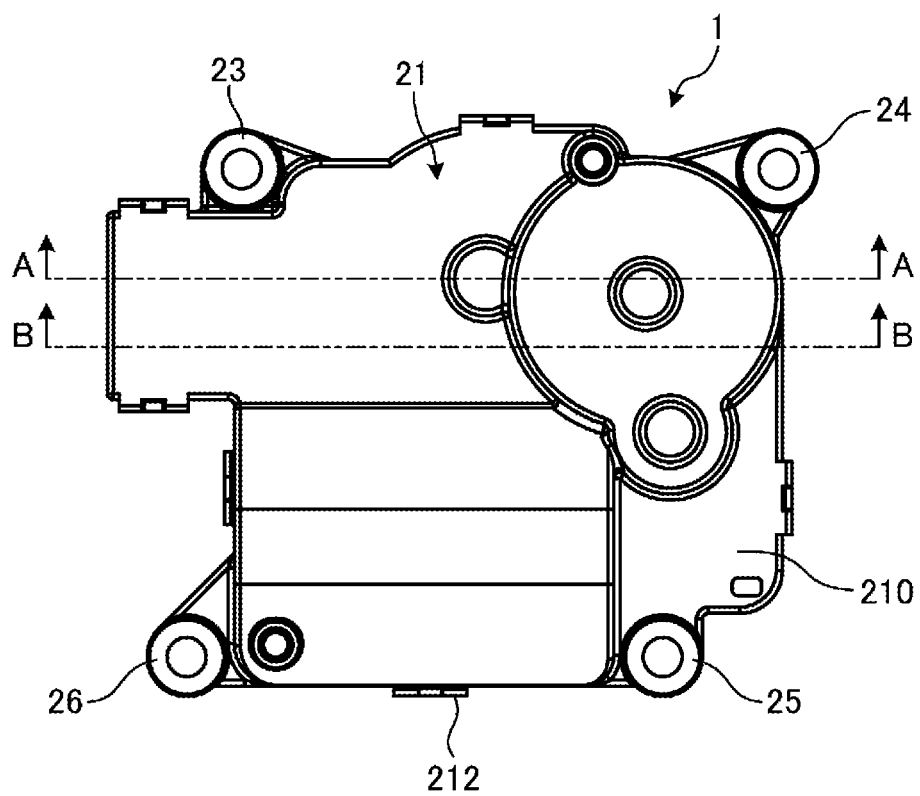
FIG. 5 is a plan view of the rotating device according to the first embodiment.
Figure 6A:
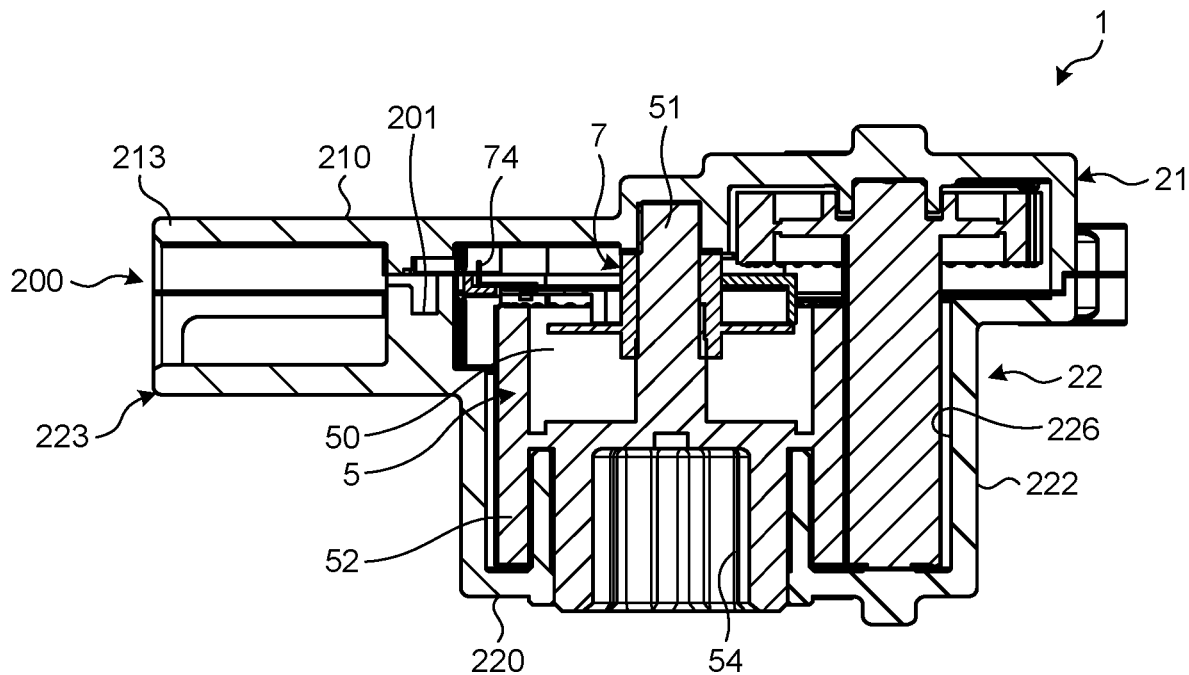
FIG. 6A is a cross-sectional view taken along a line A-A in FIG. 5.
Figure 6B:
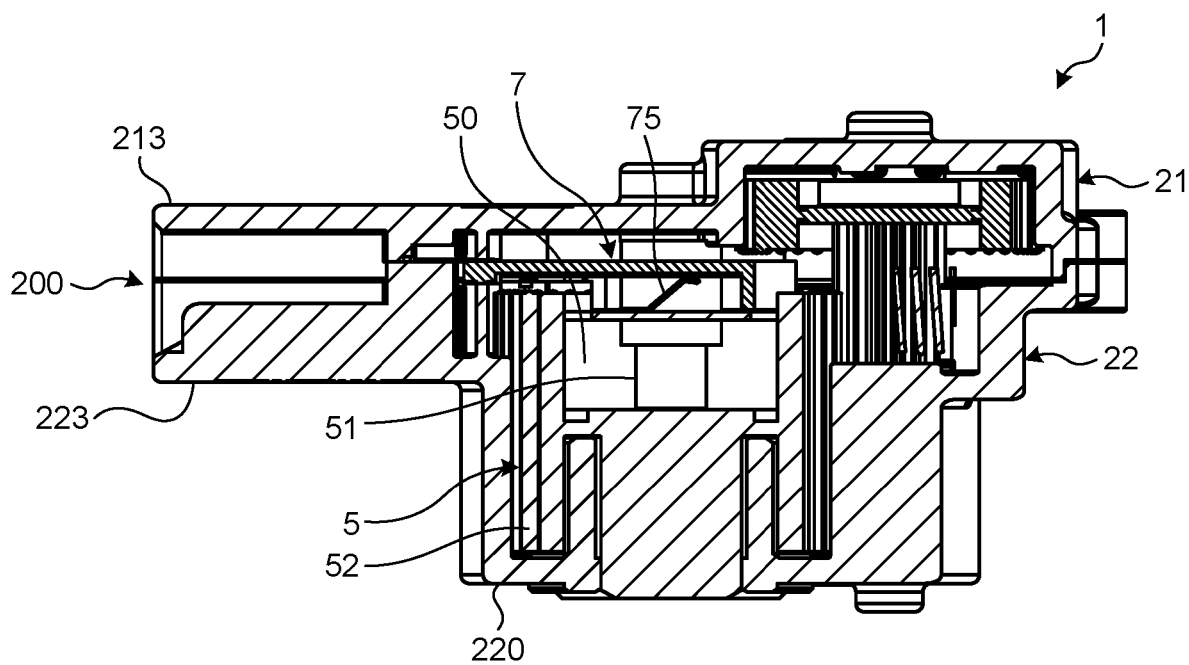
FIG. 6B is a cross-sectional view taken along a line B-B in FIG. 5.
Figure 17:
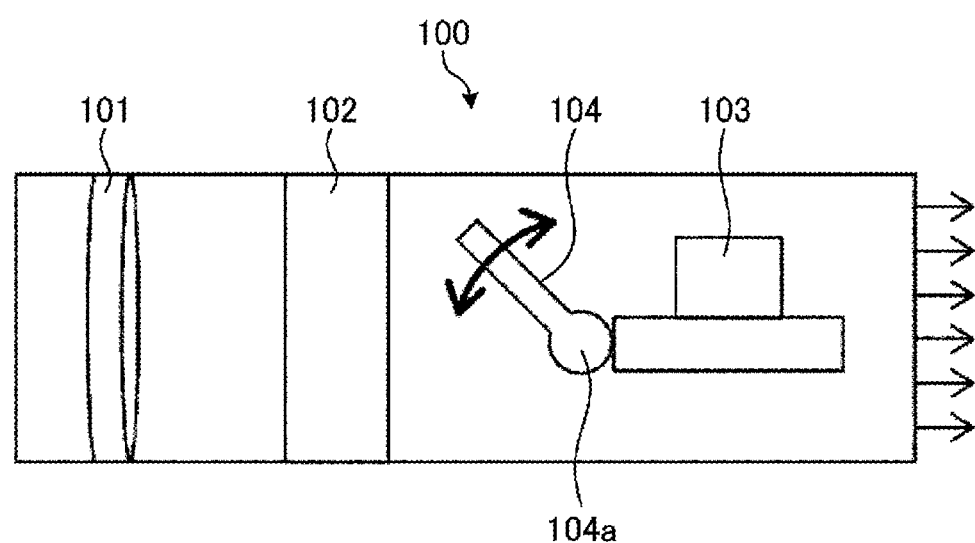
FIG. 17 is a schematic explanatory diagram illustrating an air conditioning system including a rotating device according to an embodiment.

FIG. 1 is a perspective view of a rotating device according to a first embodiment, and FIG. 2 is a perspective view of the rotating device according to the first embodiment with a first housing removed. FIG. 3 is an exploded perspective view of the rotating device according to the first embodiment, FIG. 4 is enlarged perspective view of a wiring board according to the first embodiment, and FIG. 5 is a plan view of the rotating device according to the first embodiment. FIG. 6A is a cross-sectional view taken along a line A-A in FIG. 5, and FIG. 6B is a cross-sectional view taken along a line B-B in FIG. 5. FIG. 17 is a schematic explanatory diagram illustrating an air conditioning system including a rotating device according to an embodiment.

A rotating device 1 according to an embodiment is used, for example, in an air conditioning system 100 for a vehicle as illustrated in FIG. 17, and can control a rotational motion of a louver 104 for controlling air flow or the like. The air conditioning system 100 for the vehicle includes a blower fan 101, an evaporator 102 for cooling air fed from the blower fan 101, and a heater 103 disposed downstream of the evaporator 102. The louver 104 controlling a supply amount of air flowing from the evaporator 102 side to the heater 103 side is disposed between the evaporator 102 and the heater 103, and a drive shaft 104a of the louver 104 is rotated by the rotating device 1.

As illustrated in FIG. 1, the rotating device 1 includes a housing 2 accommodating a functional part inside. Specifically, the functional part includes a motor 3, a plurality of transmission gears 6, an output gear 5, a sensor 7, and the like, to be described later.

The housing 2 is configured by connecting a first housing 21 having an opening and a second housing 22 having an opening with the openings opposing each other. The first housing 21 includes a first surface part 210 serving as a top surface part of the housing 2, a first side wall part 211 provided at an outer peripheral part of the first surface part 210, and an opening 214 surrounded by the first side wall part 211 (see FIG. 3). The second housing 22 includes a second surface part 220 (see FIGS. 6A and 6B) serving as a bottom surface part of the housing 2, a second side wall part 222 provided at an outer peripheral part of the second surface part 220, and an opening 226 (see FIGS. 3 and 6A). Note that the housing 2 is formed of a resin material such as polypropylene, polyethylene terephthalate, or ABS.

In the first housing 21, a plurality of engagement parts 212 are integrally formed at an outer periphery of the first side wall part 211 to extend toward the second housing 22 side, and the engagement parts 212 are provided with holes (hereinafter referred to as "engagement holes"). On the other hand, as illustrated in FIGS. 2 and 3, in the second housing 22, a plurality of projections (hereinafter, referred to as "engagement projections 224") corresponding to the plurality of engagement parts 212 of the first housing 21 are integrally formed at the second side wall part 222. The engagement projections 224 are engaged with the engagement holes of the engagement parts 212.

In other words, by connecting the first housing 21 and the second housing 22 such that the engagement projections 224 of the second housing 22 are engaged with the engagement holes of the engagement parts 212 of the first housing 21, the first housing 21 and the second housing 22 are integrated, and the housing 2 (see FIG. 1) accommodating functional part having various types of components illustrated in FIGS. 2 and 3 is formed.

Note that, in the present embodiment, although the engagement parts 212 are provided at the first housing 21 and the engagement projections 224 are provided at the second housing 22, the engagement parts 212 may be provided at the second housing 22 and the engagement projections 224 may be provided at the first housing 21.

As illustrated in FIGS. 3, 6A, and 6B, projecting parts 213 and 223 corresponding to each other are formed at the first housing 21 and the second housing 22, respectively. In the present embodiment, the projecting parts 213 and 223 project in an extending direction of a rotation shaft of the motor 3, or in an extending direction of a first connection terminal 74 of the sensor 7 or a second connection terminal 40 to be described later. The projecting parts 213 and 223 are joined together to form a connector part 200 (FIG. 1). The connector part 200 includes an opening 226 serving as an insertion opening for inserting an external connection terminal.

As illustrated in FIG. 3, holding parts 201 having a concave shape are formed at the connector part 200. The holding parts 201 hold a plurality of the second connection terminals 40 electrically connected to the first connection terminals 74 (FIG. 6A). The sensor 7 to be described later includes the first connection terminals 74. As illustrated in FIG. 3, a tab 40a projecting upward is formed at one end part of the second connection terminal 40. The tab 40a is paired with a distal end part of the first connection terminal 74 of the sensor 7 to be described later. For convenience, FIG. 3 illustrates a state where one second connection terminal 40 is removed from a plurality of the holding parts 201. However, a plurality (three to five) of the second connection terminals 40 are provided as necessary. The connector part 200 accommodates a connector of an external device.

Also, as illustrated in FIG. 1, four mounting parts 23, 24, 25, and 26 for mounting the rotating device 1 at a predetermined position when the rotating device 1 is incorporated into, for example, an air conditioning system are provided at the outer periphery of the first housing 21.

As illustrated in FIGS. 2 and 3, the rotating device 1 includes the motor 3, the output gear 5 mechanically outputting rotation of a rotation shaft 31 of the motor 3 to an outside, a plurality of transmission gears 6 transmitting the rotation of the motor 3 to the output gear 5, and a sensor 7 detecting a rotation angle of the output gear 5, as various components constituting the functional part accommodated at the housing 2. The sensor 7 includes a sensor part 70 and a case accommodating the sensor part 70 (hereinafter, referred to as a sensor housing 72), and the rotating device 1 can perform a rotation control of the motor 3 based on a rotation angle of the output gear 5 detected by the sensor part 70.

The plurality of transmission gears 6 includes a first transmission gear 61 and a second transmission gear 62 both configured in multiple stages, and the plurality of gears mesh to transmit the rotation of the rotation shaft 31 of the motor 3 to an output shaft 51 of the output gear 5.

Further, as illustrated in FIGS. 2 to 4, the rotating device 1 according to the present embodiment includes a wiring board 8 having a flexibility and serving as a substrate for electrically connecting the second connection terminal 40, the motor 3, and the sensor 7. An input/output signal for driving the motor 3 and a signal corresponding to the rotation angle of the output gear 5 from the sensor 7 can be obtained from the outside via the wiring board 8 and the second connection terminal 40. Here, the wording "electrically connecting" means a concept including a case of directly connecting two members and a case of connecting two members via other member. A substrate is included in the concept of a connection member to be described later.

The wiring board 8 is, for example, a printed circuit board (PCB) formed of a film having a flexibility. The wiring board 8 includes broadly three planar parts 8a, 8b, and 8c as illustrated in FIG. 4. Specifically, provided are a first planar part 8a at one end part side connected to the first connection terminal 74 and the second connection terminal 40, a second planar part 8b at the other end part side connected to a terminal 33 of the motor 3, and a third planar part 8c connecting the first planar part 8a and the second planar part 8b. In the present example, the first planar part 8a and the third planar part 8c have a substantially identical width. Also, the first planar part 8a, the second planar part 8b, and the third planar part 8c are examples of a first part, a second part, and a third part, respectively.

The first planar part 8a is provided with a hole part engaged with one end part of the first connection terminal 74 (hereinafter referred to as an "end part in a bent part side") and a hole part engaged with the tab 40a of the second connection terminal 40. The end part in the bent part side of the first connection terminal 74 and the tab 40a of the second connection terminal 40 are engaged with these hole parts and soldered for reliable electrical connection. Accordingly, a contact failure can be reduced.

The wiring board 8 having a flexibility is structured such that an adhesive layer is formed on a film (resin substrate) having a thickness of, for example, from approximately 12 µm to approximately 50 µm, and a conductor having a thickness of, for example, from approximately 12 µm to approximately 50 µm is printed or bonded on the adhesive layer. The film is formed of a resin material having an insulation property such as polyimide or polyester. The conductor is formed of a metal material such as copper. Note that the adhesive layer is formed of an epoxy-based resin or an acrylic resin. The wiring board 8 is a flexible board, and the flexible board can be restored to a shape before bending even when bent at an angle of 90 degrees or more.

Since the first connection terminal 74 and the second connection terminal 40 are connected by the wiring board 8 having a flexibility as described above, even when the first connection terminal 74 and the second connection terminal 40 are vibrated by, for example, the vibration of a vehicle such as an automobile, the wiring board 8 having a flexibility deforms (or absorbs the vibration) before a strong stress is applied to a connection part electrically connected by solder or the like, and the amplitude of the vibration is decreased. Thus, it is possible to prevent the connection part from being subjected to a strong stress and prevent the occurrence of cracks or damages at the connection part.

Also, as illustrated in FIG. 4, an integrated circuit (IC) 300 as an electronic component for controlling the motor 3 is mounted at the third planar part 8c of the wiring board 8 having a flexibility.

As illustrated in FIGS. 2 to 4, the IC 300 is mounted at a region located between the first connection terminal 74 and the second connection terminal 40, and the motor 3 electrically connected at the wiring board 8. In other words, the IC 300 is mounted at a part of the wiring board 8, and the part is located between the first connection terminal 74 and the second connection terminal 40, and the motor 3. That is, the IC 300 is mounted at a surface of the third planar part 8c having a sufficient width, the third planar part 8c being formed continuously with the first planar part 8a and having a width substantially identical to the first planar part 80a.

By using the wiring board 8 formed of the film as described above, a degree of freedom of an arrangement of the IC 300 increases. The increase in the degree of freedom allows an efficient use of a vacant space such as the use of a dead space in the housing 2 to arrange the IC 300, and thus the size or the thickness of the rotating device 1 can be reduced.

In addition, the IC 300 is in contact with the motor 3 via the wiring board 8. Further, in the present embodiment, the third planar part 8c being a part of the wiring board 8 is fixed at an outer shell of the motor 3. Here, the third planar part 8c of the wiring board 8 is fixed at the outer shell of the motor 3 by using a double-sided tape or the like.

Conventionally, in order to prevent an electronic component from being damaged by vibration from the outside, it is necessary to mount the electronic component at a wiring board made of, for example, hard glass epoxy, secure a region for fixing the wiring board made of glass epoxy in a housing, and firmly fix the wiring board in the housing.

However, since this increases the size of a rotating device, the wiring board 8 is formed of a film having a flexibility in the rotating device 1 according to the present embodiment, and thus the wiring board 8 can be easily fixed at the outer shell of the motor 3 even with a double-sided tape or the like.

As described above, the rotating device 1 according to the present embodiment has a high degree of freedom of the arrangement of electronic components such as the IC 300 for controlling the operation of the motor 3 or the like, and thus the size or the thickness of the rotating device 1 can be reduced while a space in the housing 2 is saved.

As illustrated in FIGS. 2 to 4, the wiring board 8 further includes a shield for covering the IC 300 (hereinafter referred to as a shielding member 8d). In the present embodiment, the shielding member 8d is formed continuously with the third planar part 8c, for example. That is, the wiring board 8 including the first planar part 8a, the second planar part 8b, the third planar part 8c, and the shielding member 8d is formed of, for example, a single flexible film as a whole. The shielding member 8d extends laterally of the wiring board 8, for example, in a direction intersecting an extending direction of the first planar part 8a from the third planar part 8c.

The shielding member 8d is bent at a bent part 8d0 to cover over the IC 300 mounted at the third planar part 8c. The shielding member 8d is fixed at the IC 300 by, for example, an adhesive, an adhesive tape, or the like. Note that, instead of providing the shielding member 8d with the bent part 8d0, the shielding member 8d may curve so as to cover over the IC 300.

As illustrated in FIGS. 2 to 4, a plurality of lines 8e of conductors are formed at a surface of the shielding member 8d. Note that, in the following, the lines of conductors may be simply described as "lines".

The lines 8e are metal films formed of an electrically conductive metal such as copper, for example. The lines 8e are linedin parallel at the surface of the shielding member 8d (a surface opposing a surface in contact with the IC 300), for example. In the present embodiment, an example of disposing the lines 8e along an extending direction of the shielding member 8d is described. However, no such limitation is intended, and the lines 8e may be disposed along a different direction as will be described later.

For example, when a magnetic field changes at the periphery of the shielding member 8d covering the IC 300, an induced current flows in the lines 8e due to electromagnetic induction. Accordingly, electromagnetic wave noises generated at the periphery of the shielding member 8d are canceled, and thus the IC 300 covered with the shielding member 8d is electromagnetically shielded. Note that the lines 8e may be formed at, for example, a back surface of the shielding member 8d (a surface in contact with the IC 300) as long as the lines 8e are configured to shield ambient electromagnetic wave noises.

In the following, each element constituting the functional part will be more specifically described.

Motor 3

The motor 3 is a drive device for rotating the output gear 5, and in the present embodiment, a DC motor is used as the motor 3. As illustrated in FIG. 3, the motor 3 includes a main body part 30 including an outer shell (frame) having a quadrangular prism shape with curved corner parts, the rotation shaft 31, and a pair of terminals 33, 33. The main body part 30 includes two side surfaces constituting a top surface part and a bottom surface part in a rotation axis direction of the rotation shaft 31. A part (including an end part) of the rotation shaft 31 is brought out from one side surface (the top surface part) of the main body part 30. The pair of terminals 33, 33 are provided at the other side surface (the bottom surface part) of the main body part 30 in the rotation axis direction of the rotation shaft 31. Note that a part of the rotation shaft 31 at one side is fixed at a rotor (not illustrated) accommodated in the main body part 30 of the motor 3, and a worm gear 4 is attached at a part of the rotation shaft 31 protruding from the main body 30 at the other end part side.

Transmission Gears 6

The transmission gears 6 are gears for transmitting the rotation of the rotation shaft 31 of the motor 3 to the output gear 5 at a predetermined reduction ratio (gear ratio), and, in the present embodiment, include the first transmission gear 61 and the second transmission gear 62 both configured in multiple stages, as described above. The transmission gears 6 may include the worm gear 4 attached at the rotation shaft 31 of the motor 3.

Specifically, as illustrated in FIG. 3, the transmission gears 6 include the first transmission gear 61 including a first large diameter part 611 and a first small diameter part 612, and the second transmission gear 62 including a second small diameter part 621 and a second large diameter part 622. The diameter of the first large diameter part 611 is formed to be larger than the diameter of the first small diameter part 612. The same applies to the relationship between the second large diameter part 622 and the second small diameter part 621.

The first large diameter part 611 of the first transmission gear 61 meshes with the worm gear 4 attached at the rotation shaft 31 of the motor 3. The first small diameter part 612 of the first transmission gear 61 meshes with the second large diameter part 622 of the second transmission gear 62, and the second small diameter part 621 of the second transmission gear 62 meshes with the output gear 5. The plurality of gears are meshed in this manner, and thus the rotation of the rotation shaft 31 of the motor 3 is transmitted to the output shaft 51 of the output gear 5 at a predetermined reduction ratio.

In the present embodiment, the two transmission gears configured in multiple stages, that is, the first transmission gear 61 and the second transmission gear 62 are used to transmit the rotation of the rotation shaft 31 of the motor 3 to the output gear 5 while the gear ratio is adjusted with a small space utilized. However, for example, it may be possible to make a design such that the second transmission gear 62 is omitted, and the output gear 5 is meshed with the first small diameter part 612 having a smaller diameter of the first transmission gear 61. It may be also possible to make a design such that both of the first transmission gear 61 and the second transmission gear 62 are omitted, and the output gear 5 is directly meshed with the worm gear 4.

Output Gear 5

The output gear 5 includes a recessed part 50 in a rotation axis direction of the output gear 5 (an extending direction of the output shaft 51 serving as a rotation shaft). Specifically, as illustrated in FIG. 3, the output gear 5 includes a gear main body 5a including an outer circumferential surface where a tooth row 52 is formed and the recessed part 50. The gear main body 5a has a tubular shape. A part of the sensor 7 is accommodated in the recessed part 50 formed inside the gear main body 5a.

Specifically, as illustrated in FIGS. 6A and 6B, the gear main body 5a is provided with the recessed part 50 including a bottom part formed by a side surface of the gear main body 5a, an inner wall surface, and an opening surrounded by the inner wall surface in an extending direction of the output shaft 51 passing though the center of the gear main body 5a. Then, a part of the sensor housing 72 accommodating the sensor part 70 is accommodated at an upper side of the recessed part 50, that is, at a position opposing the first surface part 210 of the first housing 21 in the recessed part 50.

Also, as described above, the second transmission gear 62 is a multistage gear including the second large diameter part 622 receiving the rotation of the motor 3 transmitted from the motor 3 and the second small diameter part 621 extending from the second large diameter part 622 and transmitting the rotation to the output gear 5. The second large diameter part 622 of the second transmission gear 62 is disposed so as to partially overlap with a part of the output gear 5 in the rotation axis direction of the output gear 5 (see FIG. 2). Accordingly, the sensor housing 72 is disposed between the second large diameter part 622 of the second transmission gear 62 and the output gear 5.

Here, when a vertical positional relationship is described, a state where the first housing 21 of the rotating device 1 is located relatively at an upper side and the second housing 22 is located relatively at a lower side is used as a reference.

Figure 16:
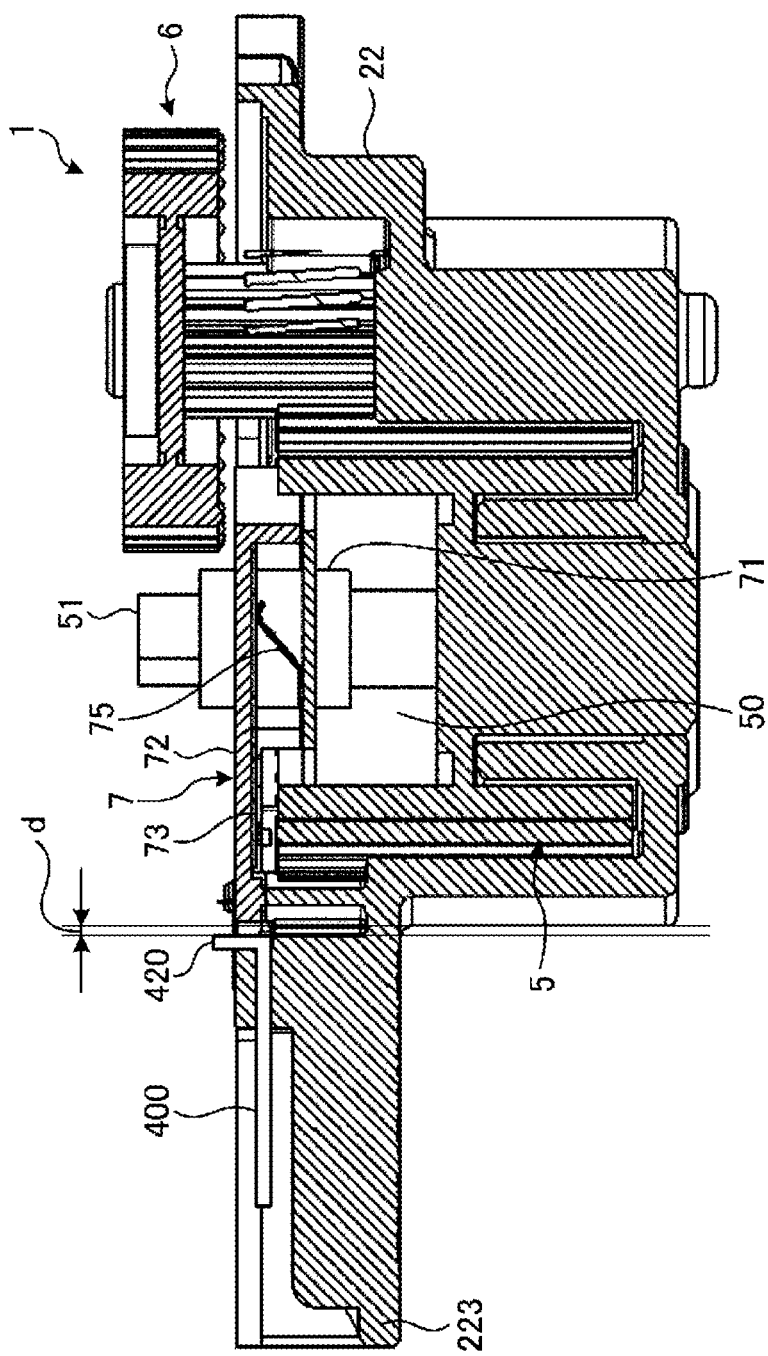
FIG. 16 is an explanatory cross-sectional view illustrating a positional relationship between the above connection terminal and a sensor housing.

In addition, the cross-sectional shape of an upper end part (one end part) of the output shaft 51 is a D-shape, and is formed in a shape capable of being fitted with a rotating plate 71 (see FIG. 16). A lower half part of the output gear 5 is formed to have a larger diameter than an upper half part of the output gear 5, and an engagement part 54 (see FIG. 6A) engaged with an external shaft such as the drive shaft 104a of the louver 104 of the air conditioning system 100 described above is formed at an inner circumferential surface of the lower half part. Accordingly, rotational operation of the louver 104 can be controlled by rotating the output gear 5, and thus the air flow and the like of the air conditioning system 100 can be adjusted (see FIG. 17).

In the meantime, as described above, the output gear 5 is connected to the drive shaft 104a of the louver 104 of the air conditioning system 100 mounted at a vehicle or the like. That is, the output gear 5 is a gear for outputting a rotational force of the rotation shaft 31 of the motor 3 as a driving force for controlling the drive shaft 104a of the louver 104. However, the present embodiment is not necessarily limited to an aspect of directly connecting a shaft to be rotated such as the drive shaft 104a of the louver 104 to the output gear 5. For example, it may be possible to employ an aspect of interposing a gear as another member between the rotating device 1 and a shaft to be rotated. In that case, a rotation shaft of the interposed gear is connected to the output gear 5.

Sensor 7

As described above, the air conditioning system 100 (see FIG. 17) or the like mounted at, for example, an automobile includes the louver 104. For driving of the louver 104 in a predetermined state, a rotation angle of the output gear 5 can be detected using the sensor 7.

In the sensor 7 according to the present embodiment, a brush 75 (see FIG. 6B) being thick in a height direction is accommodated in the sensor housing 72 for reduction of the thickness of the rotating device 1, and thus the thickness of the rotating device 1 is reduced while the sensor 7 itself goes against thickness reduction.

In the present embodiment, as illustrated in FIG. 3, hole parts engaged with the terminals 33 of the motor 3 are also provided at the second planar part 8*b* of the wiring board 8 connected to the terminals 33, and the hole parts are engaged with the terminals 33 of the motor 3 and soldered for reliable electrical connection.

In addition, in the present embodiment, the lines 8*e* of conductors are provided at the shielding member 8*d* of the wiring board 8 covering the IC 300. Thus, EMC measures can be implemented at low cost as compared with the case of using a PCB having a multi-layer power distribution configuration.

Also, as described above, the rotating device 1 according to the present embodiment includes the housing 2 accommodating the motor 3, the transmission gears 6, the output gear 5, the sensor 7, the first connection terminal 74, the second connection terminals 40, and the wiring board 8. The IC 300 is disposed at a height lower than an overall height of the motor 3 in the housing 2 in the rotation axis direction of the output gear 5. That is, the third planar part 8*c* is disposed in an inclined state along a corner part of the outer shell of the motor 3, and thus the IC 300 is disposed at a height lower than the overall height of the motor 3. The corner part of the motor 3 disposed with the third planar part 8*c* is oriented upward (toward the first housing 21) and curved.

Here, the overall height of the motor 3 in the rotation axis direction of the output gear 5 refers to the height of a part of the motor 3 located at the highest position (for example, a part of a side surface located at the highest position among side surfaces of the outer shell (frame) opposing the first surface part 210 being the top surface part of the first housing 21) relative to the second surface part 220 of the housing 2 in contact with the motor 3, that is, the bottom part of the second housing 22 (see FIGS. 1 and 3).

According to the first embodiment described above, the rotating device 1 described below is achieved.

(1) The rotating device 1 including the motor 3, the gears (the output gear 5 and the transmission gear 6) transmitting rotation of the motor 3 to an outside, and the sensor 7, wherein the sensor 7 includes the sensor part 70 and the sensor housing 72 accommodating the sensor part 70, a rotation angle of the gear is detectable by the sensor 7, the gear includes the recessed part 50 in a rotation axis direction of the gear, and a part of the sensor housing 72 is accommodated in the recessed part 50.

According to the rotating device 1 described above, a part of the sensor housing 72 is accommodated in the gear, and thus the thickness of the rotating device 1 can be reduced.

(2) In (1) described above, the sensor part 70 includes the first connection terminal 74 including one end part electrically connected to the sensor board 73 and another end part electrically connected to the outside, and the other end part of the first connection terminal 74 extends in a direction away from the bottom part of the recessed part 50 of the gears (the output gear 5 and the transmission gear 6).

Accordingly, the first connection terminal 74 can be electrically connected to the outside with ease by using a connection member, for example.

(3) In (2) described above, the second connection terminal 40 electrically connected to the first connection terminal 74 is provided at the housing 2, and the other end part of the first connection terminal 74 and one end part of the second connection terminal 40 are electrically connected via the wiring board 8.

Accordingly, the respective end parts of the first connection terminal 74 and the second connection terminal 40 can be electrically connected with ease by mounting the wiring board 8 from above at the first connection terminal 74 and the second connection terminal 40 disposed in advance. Thus, it is possible to improve the ease of assembly of the rotating device 1.

(4) In (3) described above, the wiring board 8 is formed of a film having a flexibility.

Accordingly, for example, when vibration is applied, the vibration can be absorbed by the wiring board 8 having a flexibility, and even when the first connection terminal 74 and the second connection terminal 40 are electrically connected by soldering or the like, it is possible to prevent a connection part between the first connection terminal 74 and the second connection terminal 40 from being subjected to a strong stress and prevent disconnection due to the occurrence of cracks or damages at the connection part.

(5) In any one of (1) to (4) described above, the gear with the recessed part 50 formed is the output gear 5 and includes the transmission gear 6 transmitting the rotation of the motor 3 to the output gear 5, the transmission gear 6 is a multistage gear including the large diameter part (for example the second large diameter part 622) with the rotation transmitted from the motor 3 to the diameter part and the small diameter part (for example the second small diameter part 621) extending from the second large diameter part 622 and transmitting the rotation to the output gear 5, the second large diameter part 622 is disposed so as to overlap with a part of the output gear 5 in a rotation axis direction of the gear, and the sensor housing 72 is disposed between the second large diameter part 622 and the output gear 5.

Accordingly, the thickness and the size of the rotating device 1 can be reduced while the rotation transmitted from the motor 3 is reduced at an appropriate reduction ratio.

(6) The motor 3, the gears (the output gear 5 and the transmission gear 6) transmitting rotation of the motor 3 to an outside, the sensor 7, the connection terminals (the first connection terminal 74 and the second connection terminal 40) electrically connected to the outside, the wiring board 8 electrically connecting the motor 3, the sensor 7, the connection terminals (the first connection terminal 74 and the second connection terminal 40) are provided, a rotation angle of the output gear 5 is detectable by the sensor 7, the IC 300 as an electronic component for controlling the motor 3 is mounted at the wiring board 8, and the wiring board 8 is formed of a film having a flexibility.

Accordingly, the degree of freedom of the arrangement of electronic components such as the IC 300 is high, and thus the size or the thickness can be reduced while the space in the housing 2 is saved.

(7) In (6) described above, the IC 300 as an electronic component is mounted at a region located between the connection terminals (the first connection terminal 74 and the second connection terminal 40), and the motor 3 at the wiring board 8.

Accordingly, the IC 300 can be disposed at a preferred space in the housing 2, and the thickness or the size of the housing 2 can be more reliably reduced.

(8) In (6) or (7) described above, the housing 2 accommodating the motor 3, the gears (the transmission gear 6 and the output gear 5), the sensor 7, the connection terminals (the first connection terminal 74 and the second connection terminal 40), and the wiring board 8 is provided, and the IC 300 is disposed at a height lower than an overall height of the motor 3 in the housing 2 in a rotation axis direction of the output gear 5.

Accordingly, the thickness or the size of the housing 2 can be more reliably reduced.

(9) In any one of (6) to (8) described above, electronic components such as the IC 300 are in contact with the motor 3 via the wiring board 8.

Accordingly, electronic components such as the IC 300 can be disposed in the housing 2 in a stable state while the degree of freedom of the arrangement of the electronic components is increased.

(10) In any of (6) to (9) described above, a part of the wiring board 8 is fixed at the outer shell of the motor 3.

Also, the rotating device 1 includes the motor 3, the gears (a transmission gear 6 and an output gear 5) transmitting rotation of the motor 3 to an outside, the sensor 7, the connection terminals (the first connection terminal 74 and the second connection terminal 40) electrically connected to the outside, and the wiring board 8. The wiring board 8 electrically connects the motor 3, the sensor 7, and the connection terminals (the first connection terminal 74 and the second connection terminal 40). The wiring board 8 is formed of a film having a flexibility. The rotation speed or the rotation angle of the output gear 5 is detectable by the sensor 7. The electronic component 300 controlling the motor 3 is mounted at the wiring board 8. A part of the wiring board 8 includes the bent part or the curved part and surrounds at least a part of the electronic component 300.

According to the rotating device 1, the degree of freedom of the arrangement of electronic components such as the IC 300 is high, and thus the size or the thickness can be reduced in the housing 2 while a space in the housing 2 is saved.

In addition, the plurality of lines 8e of conductors may be formed at a part of the wiring board 8, and the plurality of lines 8e of conductors may be linedin parallel, for example. Accordingly, the electronic component 300 can be shielded from the effect of electromagnetic waves.

Further, the entirety of the wiring board 8 may be formed of the single flexible film. The wiring board 8 may include the first part 8a connected to the connection terminals (the first connection terminal 74 and the second connection terminal 40), the second part 8b connected to the terminals 33 of the motor 3, and the third part 8c connecting the first part 8a and the second part 8b. In that case, the bent part or the curved part surrounding at least a part of the electronic component 300 is provided at the third part 8c. Accordingly, the wiring board 8 can be easily fixed at an outer shell of the motor 3 even with a double-sided tape or the like.

Second Embodiment

Next, a rotating device 1 according to a second embodiment will be described with reference to the drawings. Note that the rotating device 1 according to the second embodiment and the rotating device 1 according to the first embodiment described above have the same basic structure, and the same components are denoted by the same reference numerals, and a specific description will be omitted.

Figure 7:
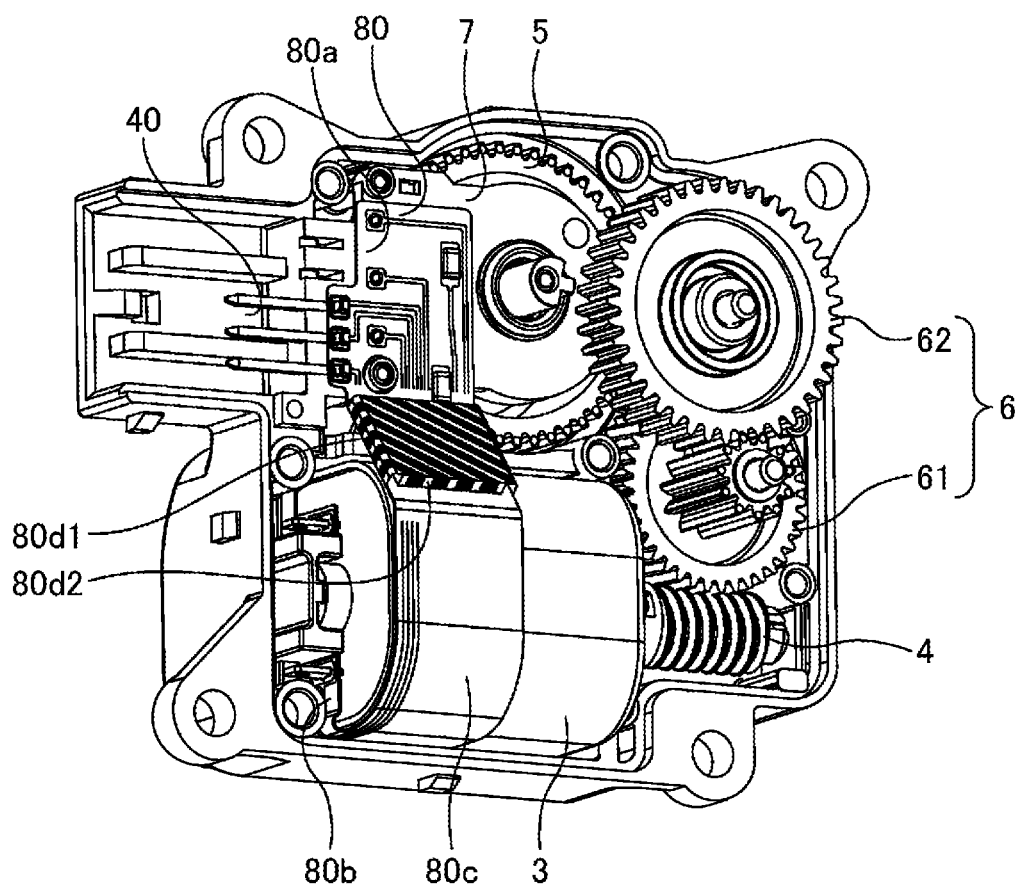
FIG. 7 is a perspective view of a rotating device according to a second embodiment with a first housing removed.
Figure 8A:
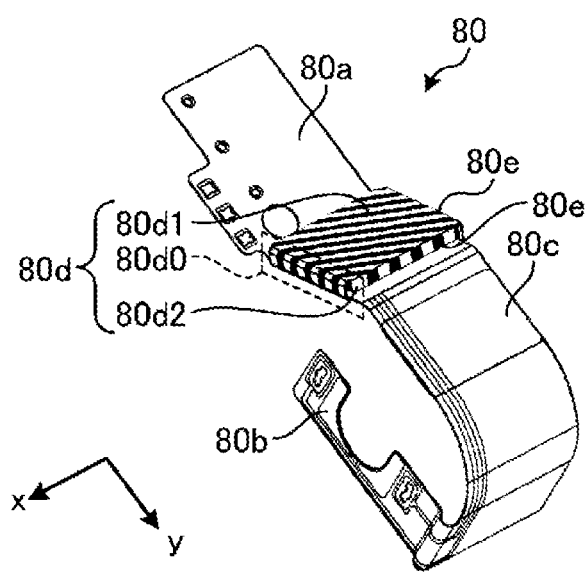
FIG. 8A is an enlarged perspective view of a wiring board according to the second embodiment.
Figure 8B:
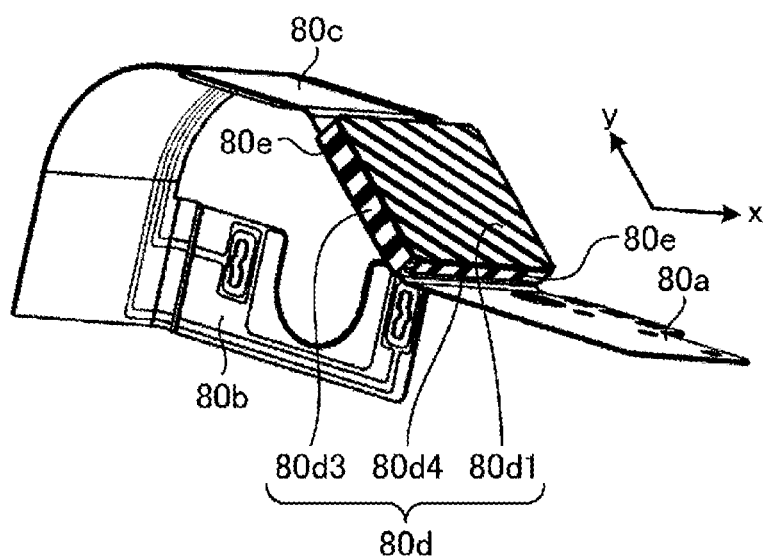
FIG. 8B is an enlarged perspective view of the wiring board according to the second embodiment.
Figure 9:
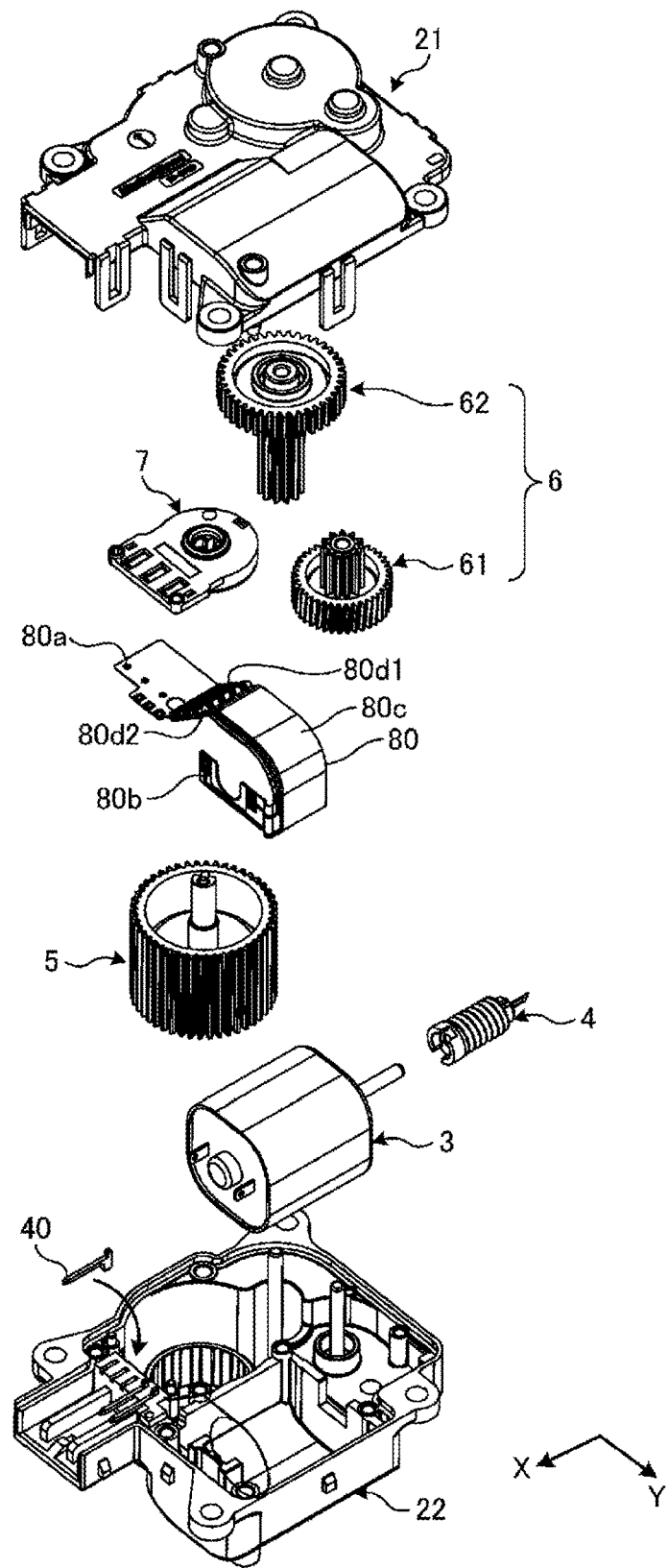
FIG. 9 is an exploded perspective view of the rotating device according to the second embodiment.

FIG. 7 is a perspective view of the rotating device according to the second embodiment with a first housing removed, FIGS. 8A and 8B are enlarged perspective views of a wiring board according to the second embodiment, and FIG. 9 is an exploded perspective view of the rotating device according to the second embodiment.

As illustrated in FIGS. 7 to 9, the rotating device 1 according to the second embodiment differs from the rotating device 1 according to the first embodiment in that the rotating device 1 according to the second embodiment includes a wiring board 80 electrically connecting the motor 3, the sensor 7, the first connection terminal 74, and the second connection terminal 40 instead of the wiring board 8.

As illustrated in FIGS. 7 to 9, the wiring board 80 includes broadly three planar parts 80a, 80b, and 80c. The planar parts 80a, 80b, and 80c correspond to the first planar part 8a, the second planar part 8b, and the third planar part 8c of the wiring board 8 described in the first embodiment, respectively. In the wiring board 80, the first planar part 80a and the third planar part 80c have a substantially identical width.

Also, as illustrated in FIGS. 7 to 9, the IC 300 is mounted at the third planar part 80c of the wiring board 80 having a flexibility. As in the first embodiment, the IC 300 is mounted at a part of the wiring board 80 located between the first connection terminal 74 and the second connection terminal 40, and the motor 3.

In addition, as illustrated in FIGS. 7 to 9, the wiring board 80 differs from the wiring board 8 according to the first embodiment in that the wiring board 80 includes shielding members 80d1 to 80d4 and a bent part 80d0 to be described later instead of the shielding member 8d. Note that, in the following, the shielding members 80d1 to 80d4 and the bent part 80d0 may simply be referred to as "shielding member 80d" when described without distinction.

Also in the present embodiment, the shielding member 80d is formed continuously with the third planar part 80c, for example. That is, the wiring board 80 including the first planar part 80a, the second planar part 80b, the third planar part 80c, and the shielding member 80d is formed of, for example, a single flexible film as a whole. The shielding member 80d extends laterally of the wiring board 80, for example, in a direction intersecting an extending direction of the first planar part 80a from the third planar part 80c.

As illustrated in FIGS. 8A and 8B, the shielding member 80d1 is bent at the bent part 80d0 to cover over an upper surface of the IC 300 mounted at the third planar part 80c. Also, as illustrated in FIG. 8A, the shielding member 80d2 extends from the shielding member 80d1 and is bent to cover over a side surface of the IC 300. Similarly, as illustrated in FIG. 8B, the shielding members 80d3 and 80d4 extend from the shielding member 80d1 and are bent to cover over other side surfaces of the IC 300.

Further, as illustrated in FIGS. 8A and 8B, the lines 80e of conductors are also formed at the shielding members 80d1 to 80d4. Note that, in the present embodiment, as illustrated in FIGS. 8A and 8B, the lines 80e of conductors are disposed obliquely with respect to an extending direction of the shielding member 80d1.

Thus, in the rotating device 1 according to the second embodiment, the IC 300 enables the IC 300 to be shielded from electromagnetic wave noises in all directions including not only the upper surface but also the side surfaces.

Third Embodiment

Next, a rotating device 1 according to a third embodiment will be described with reference to the drawings. Note that the rotating device 1 according to the third embodiment and the rotating devices 1 according to the first and the second embodiments described above have the same basic structure, and the same components are denoted by the same reference numerals, and a specific description will be omitted.

Figure 10:
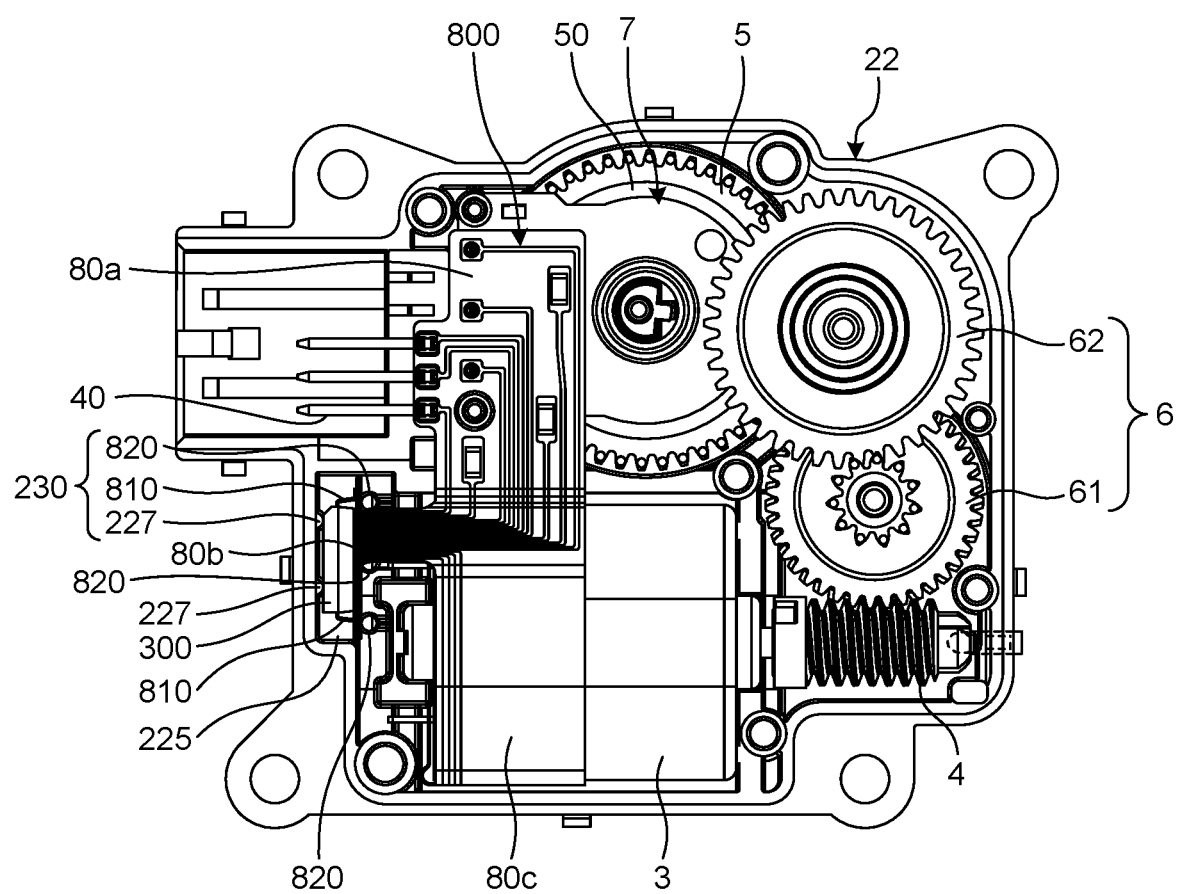
FIG. 10 is a plan view of a rotating device according to a third embodiment with a first housing removed.

FIG. 10 is a plan view of the rotating device according to the third embodiment with a first housing removed. Also, FIG. 11 is an exploded perspective view of the rotating device according to the third embodiment.

Figure 11:
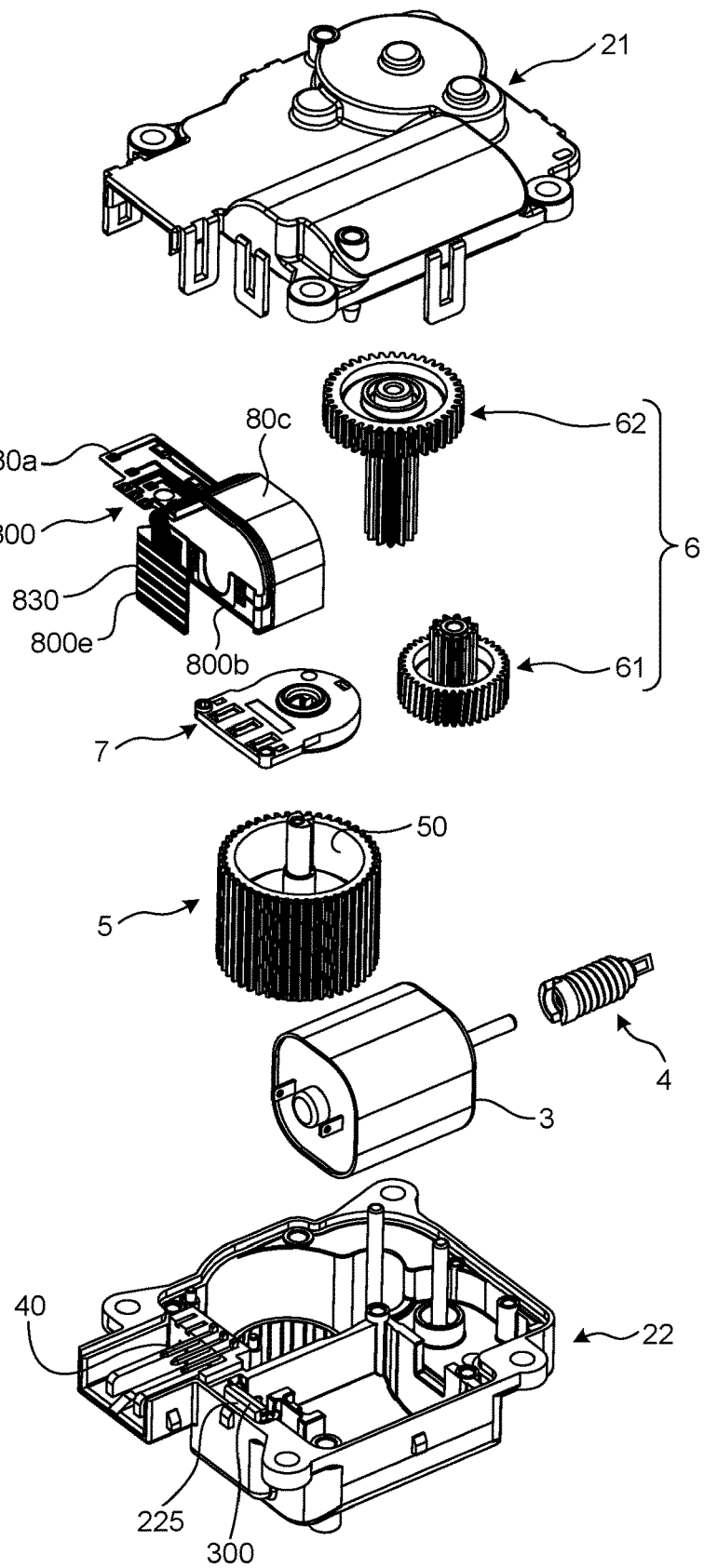
FIG. 11 is an exploded perspective view of the rotating device according to the third embodiment.

As illustrated in FIGS. 10 and 11, the rotating device 1 according to the third embodiment also includes the housing 2, the motor 3, the transmission gear 6 and the output gear 5 transmitting rotation of the motor 3 to an outside, the sensor 7, and the first connection terminal 74 and the second connection terminal 40 electrically connected to the outside, and further includes a wiring board 800 electrically connecting the motor 3, the sensor 7, the first connection terminal 74, and the second connection terminal 40. Then, the rotation angle of the output gear 5 is detectable by the sensor 7.

Also, in a manner similar to the rotating device 1 according to the second embodiment, the IC 300 as an electronic component is mounted at the wiring board 800 having a flexibility formed of a film, but a difference is that the IC 300 is held by the housing 2. That is, in the rotating device 1 according to the third embodiment, the IC 300 is mounted at the wiring board 800, and the IC 300 is held by the housing 2.

Specifically, as illustrated in FIGS. 10 and 11, a space (hereinafter referred to as a "holding space") 225 for holding the IC 300 is formed at the second housing 22 constituting the housing 2, and a plurality of holding parts 230 holding the IC 300 as an electronic component are provided at the holding space 225.

As described above, since the IC 300 mounted at the wiring board 800 is configured to be held by the housing 2, damage to the IC 300 can be prevented. In addition, even when vibration is applied, the vibration can be absorbed by the wiring board 800 having a flexibility, and thus peeling-off of solder or the like connecting wirings to the IC 300 can be prevented. Accordingly, an electrical connection between the IC 300 and the wiring board 800 can be maintained.

The plurality of holding parts 230 include a protruding part 227 protruding from an inner wall surface of the housing 2 (second housing 22), as illustrated in FIG. 10. Preferably, a distal end part of the protruding part 227 has a rounded shape or is provided with a soft material so as not to cause damage to a surface of the IC 300, for example. Further, the inner wall surface itself of the housing 2 is also included in the holding parts 230 as long as the inner wall surface can sandwich the IC 300 in cooperation with other members.

In addition, among the plurality of holding parts 230, one or two or more of the holding parts are parts of the housing 2 (second housing 22), and the IC 300 is elastically held at the housing 2 by the one or two or more holding parts.

Further, in the present embodiment, a pair of members (hereinafter referred to as "sandwiching members") 810, 810 capable of sandwiching the IC 300 from both sides are provided as one type of the holding parts 230. The sandwiching members 810 are formed of an elastic member having a higher elasticity than a member forming other holding parts 230 such as the inner wall surface of the housing 2 and the protruding part 227 described above. Here, the sandwiching members 810, 810 are formed of a plate spring.

Further, three sets of projecting members 820 supporting a component mounting part 830 may be provided as one of the holding parts 230. The projecting members 820 form the holding space in conjunction with members forming other holding parts 230 such as the inner wall surface of the housing 2 and the protruding part 227.

For positioning of the IC 300 at the holding space 225, the wiring board 800 according to the present embodiment is provided with the component mounting part 830 at a part of the second planar part 800b of the wiring board 80 used in the second embodiment. The component mounting part 830 extends laterally of the wiring board 800 from the second planar part 800b, and is bent to fit into the holding space 225 for holding the IC 300 by taking advantage of a flexible property. For example, the component mounting part 830 covers one surface of the IC 300 in a manner similar to the shielding member 8d of the wiring board 8 of the first embodiment, but the embodiment is not limited to this configuration. Also, as in the first embodiment and the second embodiment, the component mounting part 830 is fixed at the IC 300 by, for example, an adhesive, an adhesive tape, or the like.

Note that, as in the first embodiment and the second embodiment, lines 800e of conductors are formed at the component mounting part 830 of the present embodiment, as illustrated in FIG. 11.

The component mounting part 830 may cover four surfaces of the IC 300 in a manner similar to the shielding member 80d of the wiring board 80 of the second embodiment, for example.

As described above, in the rotating device 1 according to the present embodiment, the IC 300 as an electronic component is sandwiched by a plurality of holding parts such as the protruding part 227 formed at the inner wall surface of the housing 2 and the sandwiching members 810, for example.

Accordingly, damage to the IC 300 can be prevented, or an electrical connection between the IC 300 and the wiring board 800 can be maintained.

According to the third embodiment described above, the rotating device 1 described below is achieved.

(11) The housing 2, the motor 3, the gears (the output gear 5 and the transmission gear 6) transmitting rotation of the motor 3 to an outside, the sensor 7, the connection terminals (the first connection terminal 74 and the second connection terminal 40) electrically connected to the outside, and the wiring board 800 electrically connecting the motor 3, the sensor 7, the connection terminals (the first connection terminal 74 and the second connection terminal 40) are provided, a rotation angle of the output gear 5 is detectable by the sensor 7, the IC 300 as an electronic component for controlling the motor 3 is mounted at the wiring board 800, and the IC 300 is held by the housing 2.

Accordingly, damage to the IC 300 can be prevented, or an electrical connection between the IC 300 and the wiring board 800 can be maintained.

(12) In (11) described above, the wiring board 800 is formed of a film having a flexibility.

Accordingly, the degree of freedom of the arrangement of the IC 300 is increased, and thus damage to the IC 300 can be prevented, and an electrical connection between the IC 300 and the wiring board 800 can be maintained.

(13) In (11) or (12) described above, the IC 300 as an electronic component is electrically connected to the connection terminals (the first connection terminal 74 and the second connection terminal 40) via the wiring board 800.

Accordingly, in addition, vibration or the like from the outside can be absorbed by the wiring board 800, and thus peeling-off of solder connecting the IC 300 and wirings can be prevented.

(14) In any one of (11) to (13) described above, the housing 2 includes the plurality of holding parts 230 holding the IC 300.

Accordingly, the IC 300 can be more reliably held.

(15) In (14) described above, the plurality of holding parts 230 include the inner wall surface of the housing 2 or the protruding part 227 protruding from the inner wall surface.

Accordingly, the IC 300 can be more reliably held.

(16) In (14) or (15) described above, one of the plurality of holding parts 230 is formed of an elastic member (the sandwiching member 810) having a higher elasticity than a member forming the other holding parts 230.

Accordingly, transmission of vibration to the IC 300 can be further reduced.

(17) In (14) or (15) described above, among the plurality of holding parts 230, one or two or more of the holding parts 230 are parts of the housing 2 (the second housing 22), and the IC 300 is elastically held at the housing 2 (the second housing 22) by the one or two or more of the holding parts 230.

(18) In any one of (14) to (17) described above, the IC 300 is sandwiched by the plurality of holding parts 230.

Accordingly, the IC 300 can be more reliably protected.

Modification Example

In each of the embodiments described above, a configuration of disposing the plurality of lines 8e, 80e, or 800e in parallel at the wiring board 8, 80, or 800 has been described. However, embodiments are not limited to this configuration. For example, the plurality of lines of conductors may be disposed in a meshed pattern.

Figure 12:
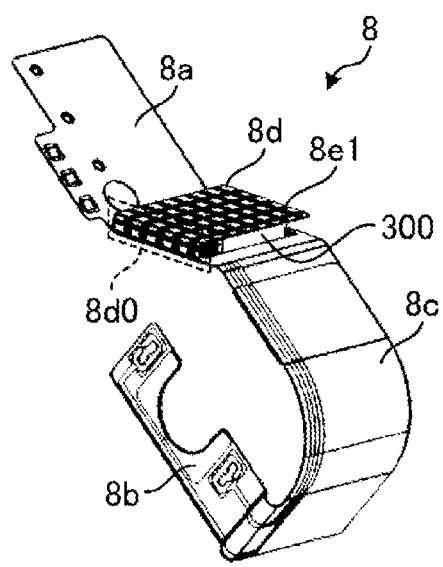
FIG. 12 is an enlarged perspective view of a wiring board according to a first modification example.

FIG. 12 is an enlarged perspective view of a wiring board according to a first modification example. As illustrated in FIG. 12, lines 8e1 are formed in parallel in an extending direction of the shielding member 8d, and are further formed in parallel in a direction intersecting the extending direction. That is, the lines 8e1 are disposed in a meshed pattern at the shielding member 8d.

In this manner, the plurality of lines 8e1 of conductors may be disposed in a meshed pattern. Accordingly, the electronic component 300 can be reliably shielded from influence of magnetic fields and electromagnetic wave noises from a plurality of directions.

Note that, the lines 8e1 are not necessarily required to be disposed as in FIG. 12, but may be disposed in a meshed pattern in an oblique direction with respect to the extending direction of the shielding member 8d. Further, the lines 80e in the second embodiment and the lines 800e in the third embodiment may also be disposed in a meshed pattern at the shielding member 80d or the component mounting part 830.

Figure 13:
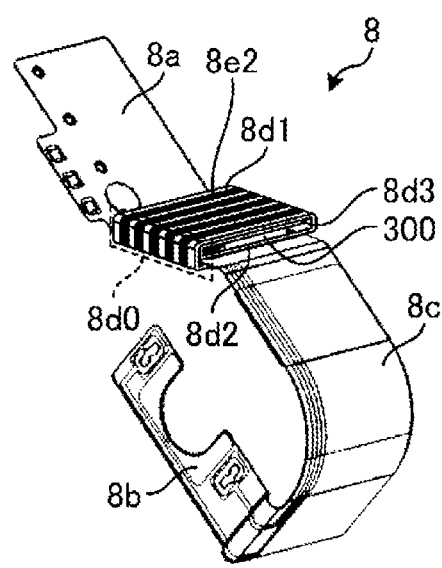
FIG. 13 is an enlarged perspective view of a wiring board according to a second modification example.

In addition, the IC 300 as an electronic component may be wound around with the shielding member 8d being a part of the wiring board 8 a plurality of turns, for example. FIG. 13 is an enlarged perspective view of a wiring board according to a second modification example. A wiring board 8 according to the present modification example includes a first shielding member 8d1, a second shielding member 8d2, and a third shielding member 8d3 instead of the shielding member 8d in the first embodiment. The first shielding member 8d1, the second shielding member 8d2, and the third shielding member 8d3 are formed for example, continuously with the third planar part 8c and extend laterally of the wiring board 8, for example, in a direction intersecting an extending direction of the first planar part 8a from the third planar part 8c. Further, lines 8e2 of conductors are also formed at the first shielding member 8d1, the second shielding member 8d2, and the third shielding member 8d3. In this case, the IC 300 may be mounted at the second shielding member 8d2 or the third shielding member 8d3 instead of at the third planar part 8c of the wiring board 8, for example.

In a manner similar to the shielding member 8d in the first embodiment, the first shielding member 8d1 of the wiring board 8 illustrated in FIG. 13 is bent at a bent part 8d0 to cover over an upper surface of the IC 300 mounted at the third shielding member 8d3. Also, the second shielding member 8d2 is bent at a part opposing the bent part 8d0 in an extending direction of the first shielding member 8d1 and thus extends so as to cover over a lower surface of the IC 300. Further, the third shielding member 8d3 is bent at a part covered by the bent part 8d0, and is bent at an opposing part in the extending direction of the first shielding member 8d1, so that the IC 300 is disposed to be sandwiched between a lower surface of the third shielding member 8d3 and an upper surface of the second shielding member 8d2. In this case, the third shielding member 8d3 is disposed to be sandwiched between the first shielding member 8d1 and the IC 300.

In this manner, the electronic component 300 may be wound around with a part of the wiring board 8 a plurality of turns. Since a part of the wiring board 8 with the lines 8e2 formed is wound around the electronic component 300 a plurality of turns, the entirety of the electronic component 300 is more reliably shielded.

In the meantime, in the first embodiment to the third embodiments described above, two terminals, that is, the first connection terminal 74 having a linear shape and the second connection terminal 40 having the shape illustrated in FIG. 3, are used as connection terminals.

That is, the first connection terminal 74 includes one end part electrically connected to the sensor 7 and the other end part electrically connected to the outside, and the second connection terminal 40 is electrically connected to the first connection terminal 74 directly or via other member.

As described above, since the rotating device 1 is configured to include the linear first connection terminal 74 with the other end part connected to the outside and the second connection terminal 40 connected to the first connection terminal 74 via a connection member, such as the wiring board 8, 80, or 800, the degree of freedom of the design of the housing 2 of the rotating device 1 is increased and the size of the housing 2 can be reduced.

On the other hand, as the second connection terminal 40 in the first embodiment to the third embodiment described above, a terminal having the shape illustrated in FIG. 3, that is, a terminal formed in a predetermined shape, for example, by punching a metal plate material is used.

However, instead of the second connection terminal described above, a terminal having a configuration described below may be used as the second connection terminal.

Figure 14:
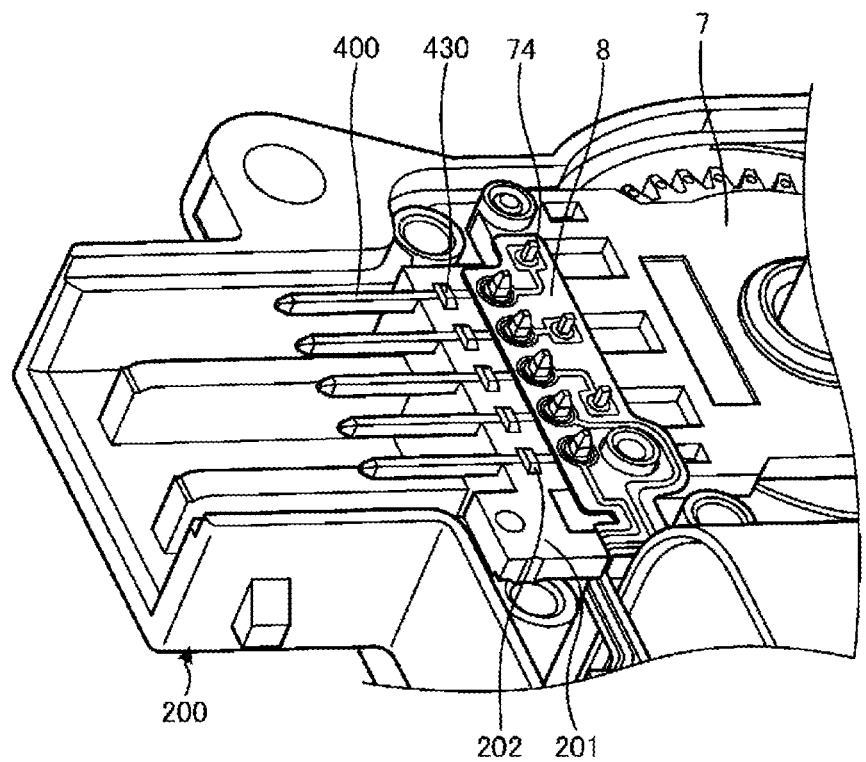
FIG. 14 is an explanatory diagram illustrating a connector part of a rotating device according to a third modification example.
Figure 15:
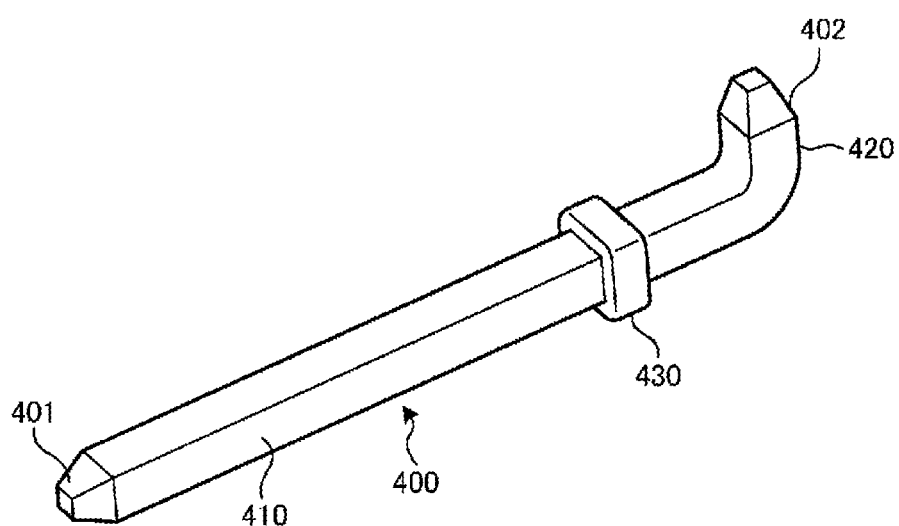
FIG. 15 is a perspective view of a connection terminal provided at the connector part of the rotating device according to the third modification example.

FIG. 14 is an explanatory diagram illustrating a connector part 200 of a rotating device 1 according to a third modification example. FIG. 15 is a perspective view of a second connection terminal provided at the connector part 200 of the rotating device 1 according to the third modification example. FIG. 16 is an explanatory cross-sectional view illustrating a positional relationship between the above second connection terminal and the sensor housing 72.

As illustrated in FIGS. 14 and 15, a second connection terminal 400 according to the third modification example is formed of a rod-shaped member having a quadrangular cross-sectional shape and includes a bent part 420 formed in one end part side and an extending part (a part of the second connection terminal 400) 410 linearly extending from the bent part 420 to the other end part. The other end part 401 of the second connection terminal 400 (hereinafter referred to as "distal end part of the extending part 410") and the one end part 402 of the second connection terminal 400 (hereinafter referred to as "distal end part in the bent part 420 side) have a slightly tapered substantially quadrangular pyramid shape. In the second connection terminal 400, the extending part 410 is located at an intermediate position between the one end part 402 and the other end part 401, and thus the extending part 410 is also an intermediate part.

Also, as illustrated in FIG. 14, the bent part 420 extends in a direction away from the bottom surface of the housing 2, that is, the second housing 22. On the other hand, a bent part is formed in the other end part side of the first connection terminal 74, and a distal end part in the bent part side extends in a direction away from the second surface part 220 constituting the bottom surface of the second housing 22. That is, the distal end part 402 in the bent part 420 side of the second connection terminal 400 extends in a same direction as the distal end part of the first connection terminal 74.

Accordingly, by connecting the end part in the bent part side of the first connection terminal 74 and the end part in the bent part 420 side of the second connection terminal 400 using the wiring board 8, 80, or 800 having a flexibility formed of a film having a flexibility, the first connection terminal 74 and the second connection terminal 400 can be easily connected. Further, as described in the embodiments above, the motor 3 and the second connection terminal 400 can also be electrically connected using the wiring board 8, 80, or 800.

Also, as illustrated in FIG. 15, the extending part 410 of the second connection terminal 400 is provided with a flange part 430 at the vicinity of the bent part 420. On the other hand, as illustrated in FIG. 14, the holding part 201 provided at the connector part 200 formed at the housing 2 is provided with a predetermined number (five in this case) of recessed parts 202 for arranging the flange parts 430 of the second connection terminals 400 in a accommodated state. Then, the second connection terminals 400 are held with the flange parts 430 inserted into the recessed parts 202. Thus, the second connection terminals 400 are securely held at the housing 2.

According to the third modification example described above, the rotary device 1 described below is achieved.

(19) The rotary device 1 includes the motor 3, the gears (the transmission gear 6 and the output gear 5) transmitting rotation of the motor 3 to an outside, the sensor 7, the plurality of connection terminals having a line shape (e.g., the first connection terminal 74 and the second connection terminal 400), and the housing 2 accommodating the gears (the transmission gear 6 and the output gear 5), the sensor 7, and the connection terminals (e.g., the first connection terminal 74 and the second connection terminal 400). A rotation angle or a rotation speed of the output gear 5 is detectable by the sensor 7. Among the plurality of connection terminals, the one connection terminal 74 includes one end part connected to the sensor 7 directly or via other member and another end part electrically connected to the outside, and the other connection terminal 400 includes the one end part 402 connected to the motor 3 directly or via other member and the other end part 401 electrically connected to the outside.

Alternatively, the rotating device 1 includes the motor 3, the gears (the transmission gear 6 and the output gear 5) transmitting rotation of the motor 3 to an outside, the sensor 7 detecting a rotation angle of the output gear 5, the first connection terminal 74 having a line shape, and the second connection terminal 400. The first connection terminal 74 includes one end part connected to the sensor 7 and the other end part electrically connected to the outside. The second connection terminal 400 is electrically connected to the first connection terminal 74 directly or via other member. Further, the second connection terminal 400 includes a bent part 420 formed in one end part side and an extending part 410 being a part linearly extending from the bent part 420 to another end part (distal end part 401).

Accordingly, the degree of freedom of the design of the housing 2 of the rotating device 1 is increased and the size of the housing 2 can be reduced.

(20) In (19) described above, the other member is a wiring board.

Accordingly, it is possible to use an existing component as it is without newly preparing a dedicated connection member, and thus the cost can be reduced.

(21) In (19) or (20) described above, in the plurality of connection terminals 400, the flange parts 430 are provided at intermediate parts between the one end parts 402 and the other end parts 401.

Accordingly, a strength of the second connection terminals 400 having a line shape can be increased.

(22) In (21) described above, the housing 2 is provided with recessed parts 202, and the flange parts 430 of the plurality of connection terminals 400 are engaged with the recessed parts 202.

Accordingly, the second connection terminals 400 can be reliably held at the housing 2.

(23) In (22) described above, the bent parts 420 are provided between the flange parts 430 and the one end parts 402.

Accordingly, it is possible to easily connect the bent part of the first connection terminal 74 and the bent part 420 of the second connection terminal 400 using a predetermined connection member such as the wiring board 8, 80, or 800, and also electrically connect the first connection terminal 74 and the second connection terminal 400 with ease.

(24) In (20) to (23) described above, the wiring board is formed of a film having a flexibility.

Accordingly, while achieving the advantages described above, it is possible to prevent peeling-off of solder connecting the first connection terminal 74 and the second connection terminal 400 to the wiring board 8, 80, or 800, or the like, since vibration or the like from the outside can be absorbed by the wiring board 8, 80, or 800.

(25) In (20) to (24) described above, the sensor 7 includes the sensor board 73 including a conductive part, and the wiring board 8, 80, or 800 and the sensor board 73 are electrically connected.

Accordingly, the wiring board 8, 80, 800 and the conductive part of the sensor board 73 may be configured to be electrically connected directly without via the connection terminal 74 or the like, for example.

(26) In (20) to (24) described above, the sensor 7 includes the sensor board 73, and includes the first connection terminal 74 electrically connected to the sensor board 73, and the first connection terminal 74 and the wiring board 8, 80, or 800 are electrically connected.

Accordingly, the sensor board 73 and the first connection terminal 74 may be configured to be packaged to provide an easy-to-handle sensor 7, for example.

Furthermore, by using a second connection terminal 400 according to the modification example, the rotating device 1 described below is achieved.

(27) In (23) described above, the bent part 420 extends in a direction away from the bottom part of the housing 2 (the second surface part 220 constituting the bottom surface of the second housing 22).

Accordingly, it is possible to easily connect the bent part of the first connection terminal 74 and the bent part 420 of the second connection terminal 400 using a predetermined connection member, and also electrically connect the first connection terminal 74 and the second connection terminal 400 with ease.

(28) In any one of (19) to (27) described above, the sensor 7 includes the sensor housing 72, and the bent part 420 of the second connection terminal 400, the other end part of the first connection terminal 74, and the sensor housing 72 are disposed and lined in a direction from the first connection terminal 74 toward the second connection terminal 400.

As a result, the sensor housing 72 and the second connection terminal 400 can be disposed as close as possible, and thus it is possible to contribute to the reduction in size of the housing 2, and consequently the reduction in size of the rotating device 1.

The present invention has been described above based on the embodiments, but the present invention is not limited to the embodiments, and it goes without saying that various modifications are possible without departing from the gist of the present invention. Various modifications within a scope not departing from the gist are included in the technical scope of the present invention, and this is obvious to a person having skill in the art from the description of the claims.

In each of the embodiments, a rotation angle of the gear is detectable by the sensor part, but no such limitation is intended, and a rotation angle and/or a rotation speed of the gear may be detectable by the sensor part.

In each of the embodiments, the wirings formed at the wiring board and the conductive part formed at a board of the sensor (sensor board) may be electrically connected by a known method such as solder, without via a connection terminal. Also, the wirings of the wiring board and the conductive part of the sensor board may come into contact so as to be electrically connected without via a connection terminal by fixing the wiring board and the sensor board with a resin or the like.

REFERENCE SIGNS LIST

1 Rotating device 2 Housing 3 Motor 4 Worm gear 5 Output gear 6 Transmission gear 7 Sensor 8, 80, 800 Wiring board 21 First housing 22 Second housing 23, 24, 25, 26 Mounting part 40 Second connection terminal 40*a* Tab 70 Sensor part 72 Sensor housing 73 Sensor board 75 Brush 210 First surface part 211 First sidewall part 220 Second surface part 222 Second sidewall part 224 Engagement projection 212 Engagement part 213, 223 Projecting part 200 Connector part 100 Air conditioning system 101 Blower fan 102 Evaporator 103 Heater 104 Louver 104*a* Drive shaft 74 First connection terminal 61 First transmission gear 62 Second transmission gear 51 Output shaft 30 Main body part 31 Rotation shaft 33 Terminal 611 First large diameter part 612 First small diameter part 621 Second small diameter part 622 Second large diameter part 50 Recessed part 52 Tooth row 201 Holding part 300 IC 8*a*, 80*a* First planar part 8*c*, 80*c* Third planar part 8*b*, 80*b*, 800*b* Second planar part 8*d*, 80*d* Shielding member 8*e*, 8*e*1, 8*e*2, 80*e*, 800*e* Line 225 Holding space 230 Holding part 227 Protruding part 810 Sandwiching member 820 Projecting member 830 Component mounting part 400 Second connection terminal 420 Bent part 410 Extending part 401, 402 Distal end part.

The invention claimed is:

1. A rotating device comprising:
    a housing;
    a motor;
    a gear configured to transmit rotation of the motor to an outside;
    a sensor;
    a connection terminal electrically connected to the outside; and
    a wiring board electrically connecting the motor, the sensor, and the connection terminal, wherein
        the wiring board is formed of a film having a flexibility,
        a rotation speed or rotation angle of the gear is detectable by the sensor,
        an electronic component configured to control the motor is mounted at the wiring board,
        a part of the wiring board includes a bent part or a curved part and surrounds a part of the electronic component, and
        the part of the wiring board is wound around the electronic component a plurality of turns.

2. The rotating device according to claim 1, wherein a plurality of lines of conductors are formed at the part of the wiring board.

3. The rotating device according to claim 2, wherein the plurality of lines of conductors are lined in parallel or disposed in a meshed pattern.

4. The rotating device according to claim 1, wherein of the wiring board is formed of the single film having a flexibility.

5. The rotating device according to claim 1, wherein
    the wiring board includes a first part connected to the connection terminal, a second part connected to a terminal of the motor, and a third part connecting the first part and the second part, and
    the bent part or the curved part surrounding a part of the electronic component is provided at the third part.

6. The rotating device according to claim 1, wherein the electronic component is electrically connected to the connection terminal via the wiring board.

7. The rotating device according to claim 1, wherein
    the electronic component is held by the housing, and
    the housing includes a plurality of holding parts holding the electronic component.

8. The rotating device according to claim 7, wherein the plurality of holding parts include an inner wall surface of the housing or a protruding part protruding from the inner wall surface.

9. The rotating device according to claim 7, wherein one of the plurality of holding parts is formed of an elastic member having a higher elasticity than a member forming other holding part of the holding parts.

10. The rotating device according to claim 7, wherein
    among the plurality of holding parts, one or two or more of the holding parts are parts of the housing, and
    the electronic component is elastically held at the housing by the one or two or more of the holding parts.

11. The rotating device according to claim 7, wherein the electronic component is sandwiched by the plurality of holding parts.

* * * * *